(12) United States Patent
Wen (10) Patent No.: US 11,855,620 B2
(45) Date of Patent: *Dec. 26, 2023

(54) MULTIPLEXING CIRCUIT, OUTPUT STAGE, AND SEMICONDUCTOR DEVICE

(71) Applicant: TAIWAN SEMICONDUCTOR MANUFACTURING COMPANY LTD., Hsinchu (TW)

(72) Inventor: Chin Hua Wen, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/163,295

(22) Filed: Feb. 2, 2023

(65) Prior Publication Data

US 2023/0179204 A1 Jun. 8, 2023

Related U.S. Application Data

(63) Continuation of application No. 17/461,696, filed on Aug. 30, 2021, now Pat. No. 11,575,378.

(51) Int. Cl.
*H03K 17/693* (2006.01)
*H03K 17/687* (2006.01)
*H03H 7/38* (2006.01)

(52) U.S. Cl.
CPC ....... *H03K 17/693* (2013.01); *H03K 17/6871* (2013.01); *H03H 7/38* (2013.01)

(58) Field of Classification Search
CPC .................. H03K 17/693; H03K 17/6871
See application file for complete search history.

(56) References Cited

U.S. PATENT DOCUMENTS 5,854,566 A * 12/1998 Kwon .................. H03K 17/693
327/403

FOREIGN PATENT DOCUMENTS

JP          2009055692 A  *  3/2009

* cited by examiner

*Primary Examiner* — Metasebia T Retebo
(74) *Attorney, Agent, or Firm* — WPAT LAW; Anthony King (57) ABSTRACT

A multiplexing circuit including an output terminal, a first type transistor, a second type transistor and an impedance circuit; the first type transistor is coupled to the output terminal, wherein a gate terminal of the first type transistor is configured to receive a control signal and free from receiving a clock signal; the second type transistor is coupled to the output terminal, wherein a gate terminal of the second type transistor is configured to receive the clock signal, and the first type transistor is different from the second type transistor; the impedance circuit is arranged to provide an impedance between the gate terminal of the first type transistor and the output terminal, wherein the impedance circuit is free from connecting to the gate terminal of the second type transistor.

20 Claims, 12 Drawing Sheets

MULTIPLEXING CIRCUIT, OUTPUT STAGE, AND SEMICONDUCTOR DEVICE

CROSS REFERENCE TO RELATED APPLICATIONS

This application is a continuation of U.S. application Ser. No. 17/461,696, filed on Aug. 30, 2021, which application is hereby incorporated herein by reference.

BACKGROUND

As the operating data rate increases, the limited bandwidth will result in the large jitter noise from the Intersymbol interference (ISI) effects, which is an obstacle for achieving higher bandwidth requirement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The next data rate that the industry has indicated a desire to implement is 100 Gbps over a single differential pair to enable more efficient, cost effective and faster equipment, systems and networks. The next generation 112 Gbps data rate to provide signalling over a multitude of link types including die to die, chip to chip, chip to module, medium reach chip to chip and long reach chip to chip is thus developed.

However, it can be foreseen that achieving the bandwidth requirement will be an obstacle in the near future. After study, one of the difficulties needs to be overcome for achieving the bandwidth requirement is the large jitter noise induced by the intersymbol interference (ISI) effect.

The ISI effect is a form of distortion of a signal in which one symbol interferes with subsequent symbols. This is an unwanted phenomenon as the previous symbols have similar effect as noise, thus making the communication less reliable. The distortion induced by the ISI effect can usually be deduced on the eye diagram. Normally, the effects o receiving delayed and distorted versions of the signal can be seen in the loss of definition of the signal transitions. It also reduces both the noise margin and the window in which the signal can be sampled, which shows that the performance of the system will be worse.

The present disclosure proposes a multiplexing circuit, an output stage and a semiconductor device which can at least ease the ISI effect and achieve higher bandwidth requirement.

Figure 1:
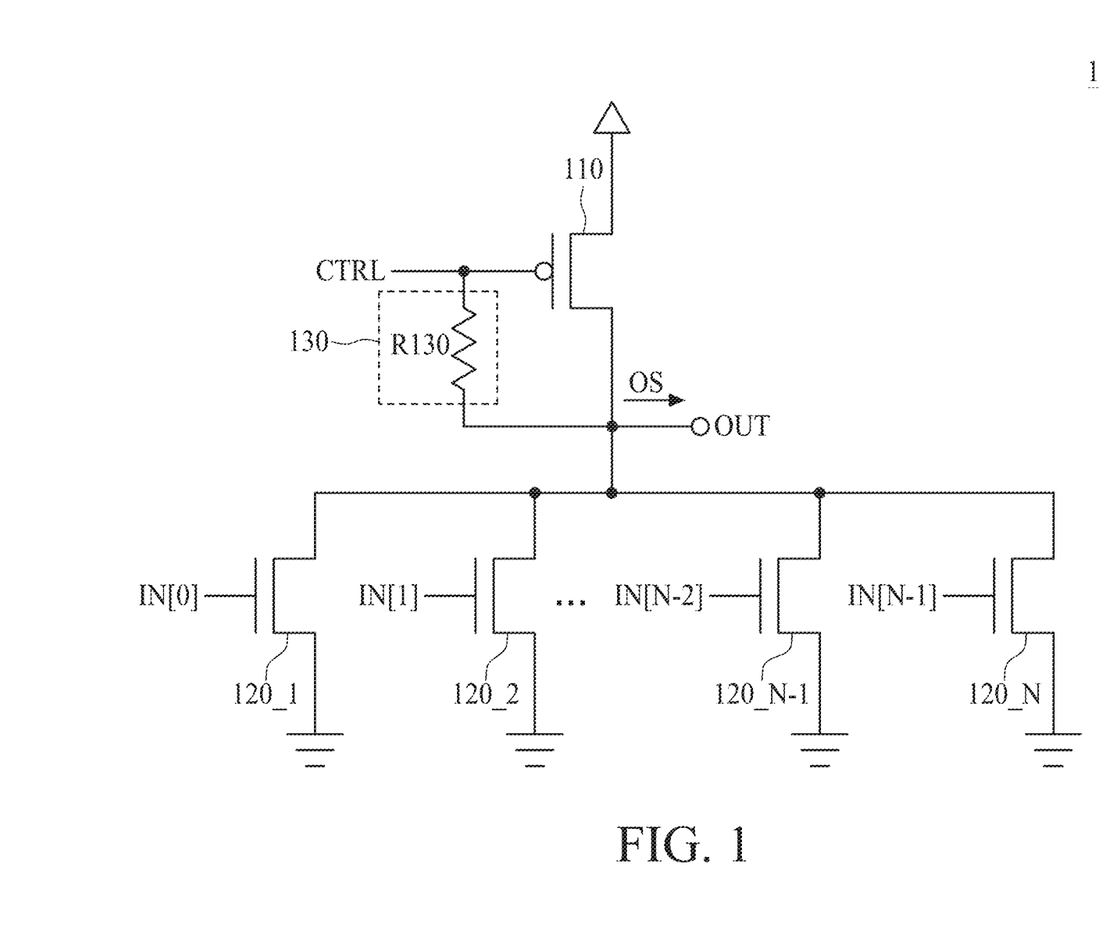
FIG. 1 is a diagram illustrating a multiplexing circuit in accordance with an embodiment of the present disclosure.

FIG. 1 is a diagram illustrating a multiplexing circuit 1 in accordance with an embodiment of the present disclosure. The multiplexing circuit 1 includes an output terminal OUT, a first type transistor 110, second type transistors 120_1, 120_2, . . . , and 120_N, and an impedance circuit 130, wherein N is a natural number. The multiplexing circuit 1 is arranged to convert an input signal IN including N bits into a serial output signal OS on the output terminal OUT. In some embodiments of the present disclosure, the serial output signal OS on the output terminal OUT is one of the differential input signals for the next stage.

In some embodiments of the present disclosure, the first type transistor 110 is implemented by a P-type Metal Oxide Semiconductor (PMOS). In some embodiments of the present disclosure, a gate terminal of the first type transistor 110 is arranged to receive a control signal CTRL. The control signal CTRL is arranged to make the first type transistor 110 equivalent to a resistor. In some embodiments of the present disclosure, a source terminal of the first type transistor 110 is coupled to a first reference voltage, and a drain terminal of the first type transistor 110 is coupled to the output terminal OUT. In some embodiments of the present disclosure, the first reference voltage is a supply voltage arranged to provide a fixed voltage.

In some embodiments of the present disclosure, each of the second type transistors 120_1 to 120_N is implemented by an N-type MOS (NMOS). In some embodiments of the present disclosure, each gate terminal of the second type transistors 120_1 to 120_N receives a bit of an input signal IN. For example, the gate terminal of the second transistor 120_1 receives a first bit IN[0] of the input signal IN, the gate terminal of the second transistor 120_2 receives a second bit INN of the input signal IN, and so on. It should be noted that, the number of the second type transistor included in the multiplexing circuit 1 is determined by the number of bits included in the input signal IN.

In some embodiments of the present disclosure, each drain terminal of the second type transistors 120_1 to 120_N is coupled to the output terminal OUT, and each source terminal of the second type transistors 120_1 to 120_N is coupled to a second reference voltage. For example, the second reference voltage is a ground voltage.

In some embodiments of the present disclosure, the impedance circuit 130 is arranged to provide an impedance between the gate terminal of the first type transistor 110 and the output terminal OUT. In some embodiments of the present disclosure, the impedance circuit 130 includes a resistor R130. In some embodiments of the present disclosure, one terminal of the resistor R130 is coupled to the gate terminal of the first type transistor 110, and another terminal of the resistor R130 is coupled to the output terminal OUT. In some embodiments of the present disclosure, the resistance of the resistor R130 ranges from 3K ohm to 5K ohm.

It should be noted that, the multiplexing circuit 1 proposed by the present disclosure is free from coupling a physical passive inductor to the output terminal OUT, which consumes less chip area and facilitate the IC integration.

Figure 2:
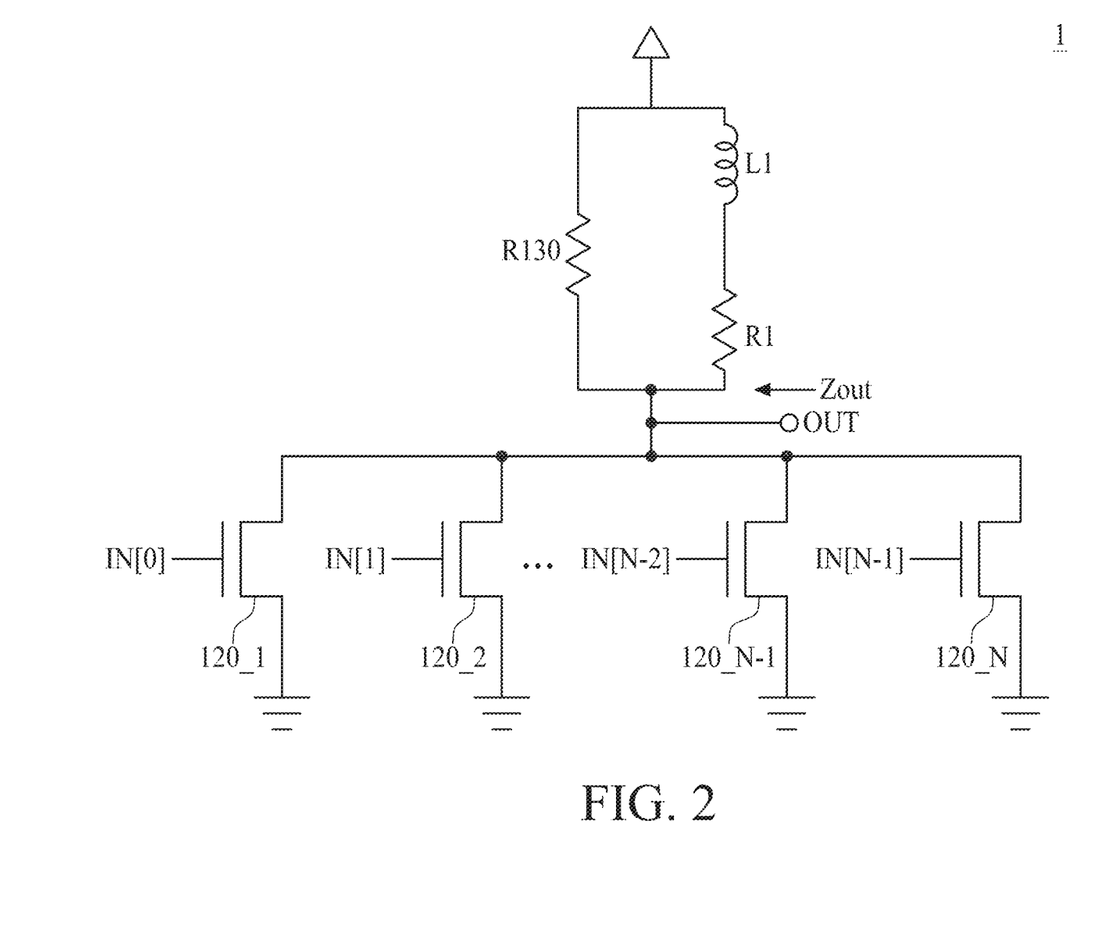
FIG. 2 is a diagram illustrating an equivalent circuit of the multiplexing circuit in accordance with an embodiment of the present disclosure.

FIG. 2 is a diagram illustrating an equivalent circuit of the multiplexing circuit 1 in accordance with an embodiment of the present disclosure. In some embodiments of the present disclosure, the equivalent circuit of the multiplexing circuit 1 includes an inductor L1 and a resistor R1 connected in series between the first reference voltage and the output terminal OUT. In some embodiments of the present disclosure, The resistance of the resistor R1 can be represented as:

$$R1 = 1/(gm - 1/R130),$$

wherein gm is the transconductance of the first type transistor 110. In some embodiments of the present disclosure, the inductance of the inductor L1 can be represented as:

$$L1 = R130 * Cgs/(gm - 1/R130),$$

wherein Cgs is the capacitance seen from the gate terminal of the first type transistor 110. It can be seen from the equations above, the inductor L1 is formed on the output terminal OUT due to the existence of the resistor R130.

Because the inductance of the inductor L1 is positively related to the operating frequency and the inductor L1 is connected to the resistor R1 in series, an equivalent impedance Zout seen from the output terminal OUT is increased in a high frequency band. In some embodiments of the present disclosure, the high frequency band ranges from 10 GHz to 100 GHz. Because the inductance of the inductor L1 is positively related to the operating frequency and the inductor L1 is connected to the resistor R130 in parallel, the equivalent impedance Zout seen from the output terminal OUT is decreased in a low frequency band. In some embodiments of the present disclosure, the low frequency band ranges from direct current (DC, i.e., 0 Hz) to 10 GHz.

Figure 3:
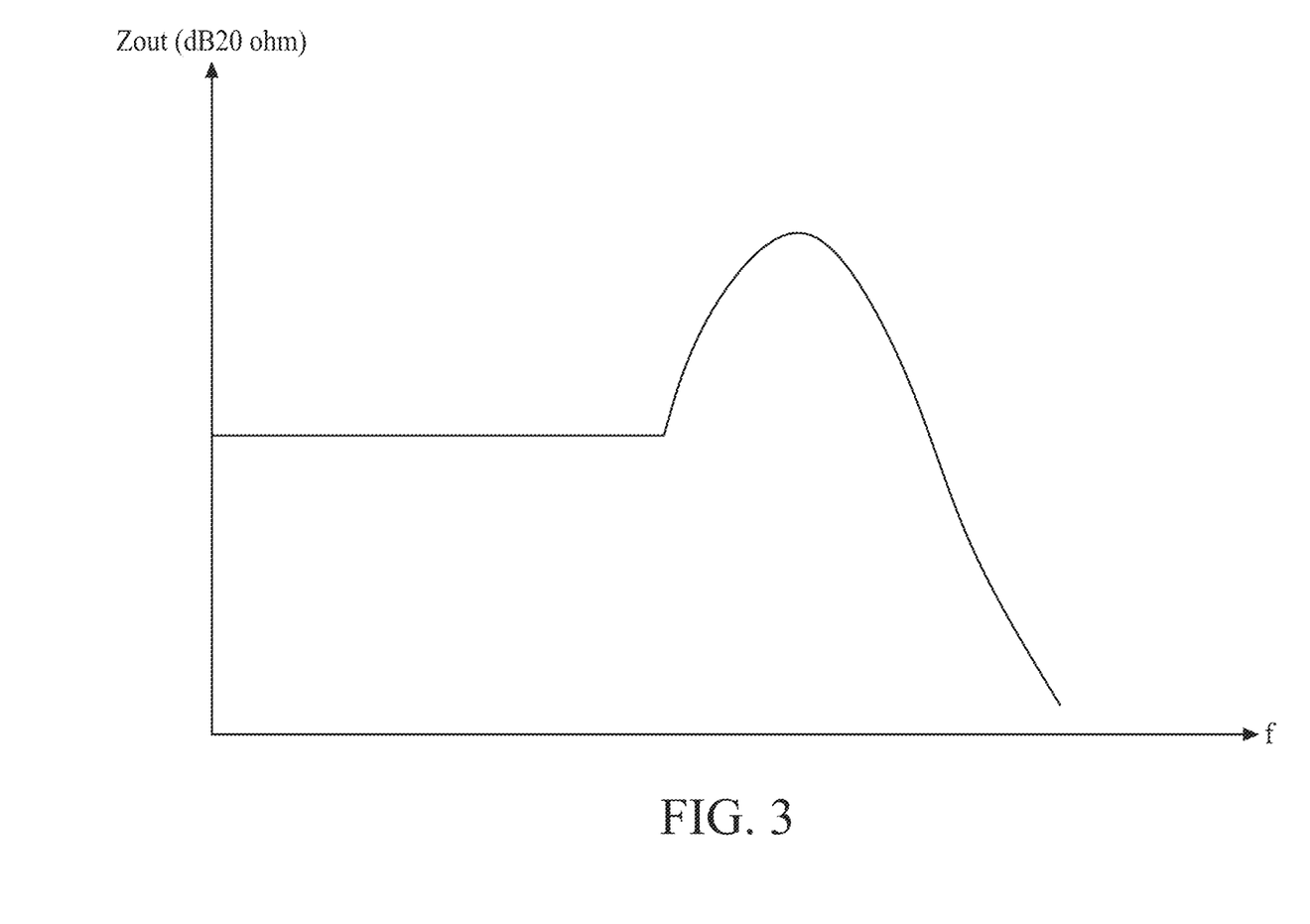
FIG. 3 is a diagram illustrating a frequency response of an equivalent impedance seen from an output terminal of a multiplexing circuit in accordance with an embodiment of the present disclosure.

FIG. 3 is a diagram illustrating a frequency response of the equivalent impedance Zout seen from the output terminal OUT of the multiplexing circuit 1 in accordance with an embodiment of the present disclosure. As shown in FIG. 3, the equivalent impedance Zout seen from the output terminal OUT has a peak in a high frequency band. In some embodiments of the present disclosure, the high frequency band ranges from 10 GHz to 100 GHz. As shown in FIG. 3, the equivalent impedance Zout seen from the output terminal OUT has a relatively flat and low profile in a low frequency band. In some embodiments of the present disclosure, the low frequency band ranges from DC to 10 GHz. The profile of the equivalent impedance Z11 in response to frequency directs to a wider eye window in eye diagram which will be discussed in the following paragraphs.

Figure 4:
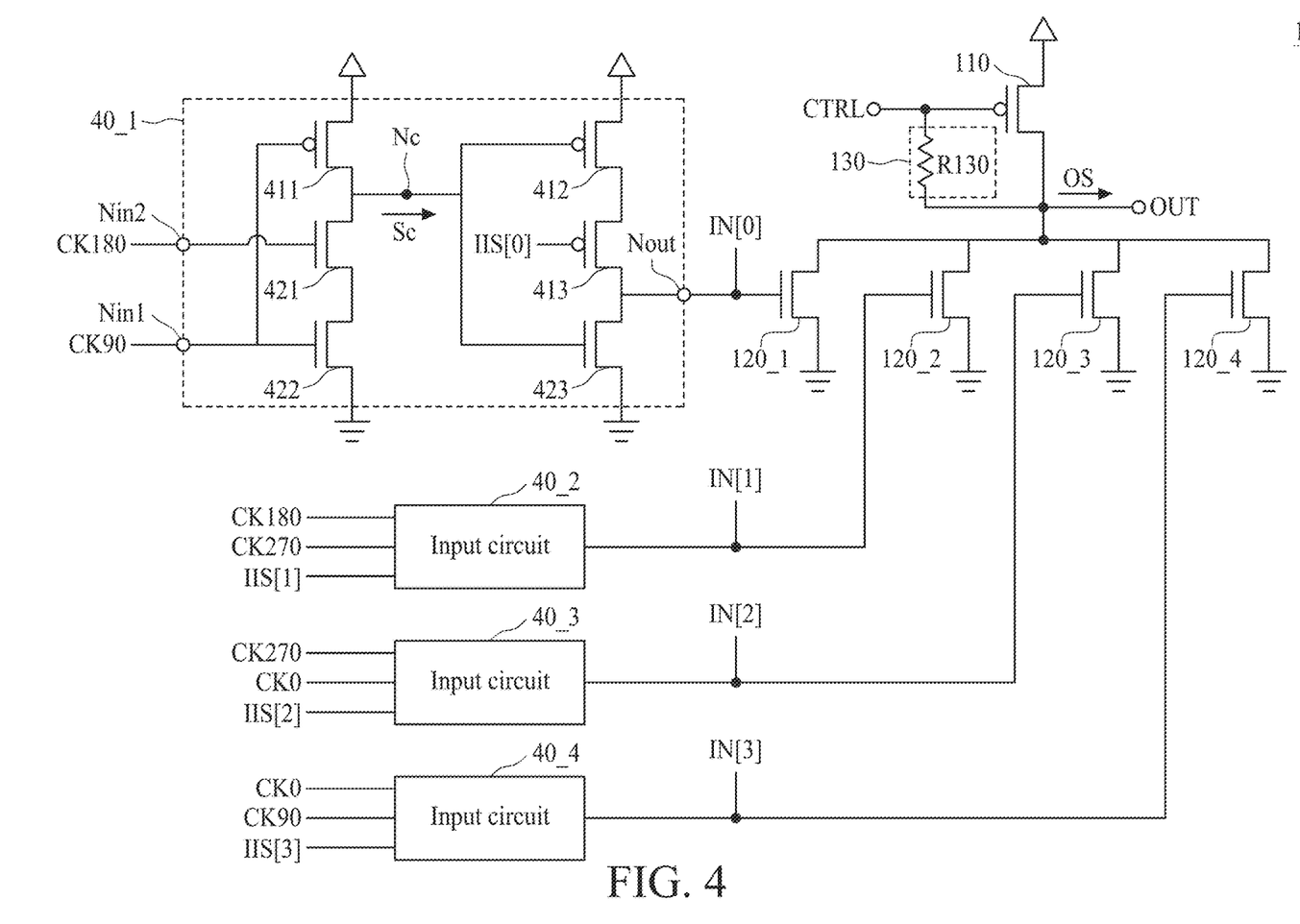
FIG. 4 is a diagram illustrating an input stage of a multiplexing circuit in accordance with an embodiment of the present disclosure.

FIG. 4 is a diagram illustrating an input stage of the multiplexing circuit 1 in accordance with an embodiment of the present disclosure. For brevity, the input signal IN is depicted as a four bits signal. Correspondingly, the multiplexing circuit 1 includes the second type transistors 120_1, 120_2, 120_3 and 120_4, wherein each of the second type transistors 120_1, 120_2, 120_3 and 120_4 receives the corresponding bit of the input signal IN.

The input stage of the multiplexing circuit 1 includes input circuits 40_1, 40_2, 40_3 and 40_4. The input circuit 40_1 receives a first clock signal CK90 and a second clock signal CK180, and outputs the first bit IN[0] of the input signal IN. The input circuit 40_2 receives the second clock signal CK180 and a third clock signal CK270, and outputs the second bit IN[1] of the input signal IN. The input circuit 40_3 receives the third clock signal CK270 and a fourth clock signal CK0, and outputs the third bit IN[2] of the input signal IN. The input circuit 40_4 receives the fourth clock signal CK0 and the first clock signal CK90, and outputs the fourth bit IN[3] of the input signal IN.

In some embodiments of the present disclosure, the phase difference between the first clock signal CK90 and the second clock signal CK180 is 90 degrees. In some embodiments of the present disclosure, the phase difference between the second clock signal CK180 and the third clock signal CK270 is 90 degrees. In some embodiments of the present disclosure, the phase difference between the third clock signal CK270 and the fourth clock signal CK0 is 90 degrees. In some embodiments of the present disclosure, the phase difference between the fourth clock signal CK0 and the first clock signal CK90 is 90 degrees.

In FIG. 4, the input circuit 40_1 is shown for example to elaborate the detailed architecture. The input circuit 40_1 includes a first input terminal Nin1, a second input terminal Nin2, and a sub-output terminal Nout. The first input terminal Nin1 is arranged to receive the first clock signal CK90. The second input terminal Nin2 is arranged to receive the second clock signal CK180. The sub-output terminal is coupled to the gate terminal of the second type transistor 120_1 and arranged to output the first bit IN[0] of the input signal IN.

The input circuit 40_1 further includes a first stage and a second stage. The first stage outputs a signal Sc to a connection terminal Nc in accordance with the first clock signal CK90 and the second clock signal CK180. The second stage outputs the first bit IN[0] of the input signal IN to the sub-output terminal Nout in accordance with the signal Sc and an input indicating signal IIS[0].

The first stage includes a first type transistor 411 and second type transistors 421 and 422. The second stage includes first type transistors 412 and 413 and a second type transistor 423.

In some embodiments of the present disclosure, the first type transistor 411 is implemented by a PMOS. In some embodiments of the present disclosure, a gate terminal of the first type transistor 411 is coupled to the first input terminal Nin1 to receive the first clock signal CK90. In some embodiments of the present disclosure, a source terminal of the first type transistor 411 is coupled to the first reference voltage and a drain terminal of the first type transistor 411 is coupled to the connection terminal Nc. For example, the first reference voltage is a supply voltage arranged to provide a fixed voltage.

In some embodiments of the present disclosure, the second type transistor 421 is implemented by a NMOS. In some embodiments of the present disclosure, a gate terminal of the second type transistor 421 is coupled to the second input terminal Nin2 to receive the second clock signal CK180. In some embodiments of the present disclosure, a drain terminal of the second type transistor 421 is coupled to the connection terminal Nc and a source terminal of the second type transistor 421 is coupled to a drain terminal of the second type transistor 422.

In some embodiments of the present disclosure, the second type transistor 422 is implemented by a NMOS. In some embodiments of the present disclosure, a gate terminal of the second type transistor 422 is coupled to the first input terminal Nin1 to receive the first clock signal CK90. In some embodiments of the present disclosure, a source terminal of the second type transistor 422 is coupled to the second reference voltage. For example, the second reference voltage is a ground voltage.

In some embodiments of the present disclosure, the first type transistor 412 is implemented by a PMOS. In some embodiments of the present disclosure, a gate terminal of the first type transistor 412 is coupled to the connection terminal Nc. In some embodiments of the present disclosure, a source terminal of the first type transistor 412 is coupled to the first reference voltage and a drain terminal of the first type transistor 412 is coupled to a source terminal of the first type transistor 413. For example, the first reference voltage is a supply voltage arranged to provide a fixed voltage.

In some embodiments of the present disclosure, the first type transistor 413 is implemented by a PMOS. In some embodiments of the present disclosure, a gate terminal of the first type transistor 413 is arranged to receive the input indicating signal IIS[0]. In some embodiments of the present disclosure, a drain terminal of the first type transistor 413 is coupled to the sub-output terminal Nout.

In some embodiments of the present disclosure, the second type transistor 423 is implemented by a NMOS. In some embodiments of the present disclosure, a gate terminal of the second type transistor 423 is coupled to the connection terminal Nc. In some embodiments of the present disclosure, a drain terminal of the second type transistor 423 is coupled to the sub-terminal Nout and a source terminal of the second type transistor 423 is coupled to the second reference voltage. For example, the second reference voltage is a ground voltage.

Those skilled in the art should understand that the input circuits 40_2, 40_3 and 40_4 can be implemented by the same architecture of the input circuit 40_1.

Figure 5A:
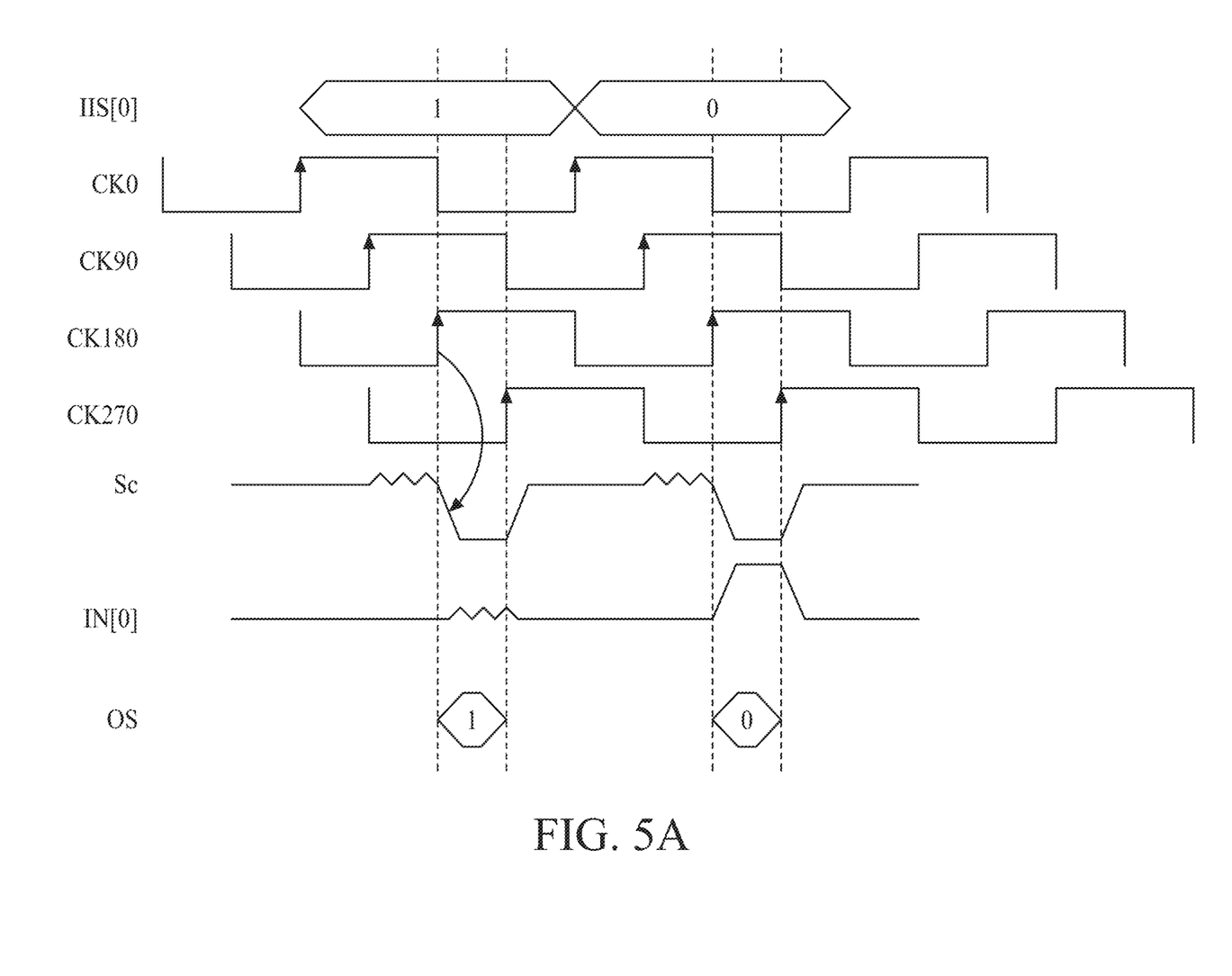
FIGS. 5A to 5D are diagrams illustrating the operations of input circuits in accordance with an embodiment of the present disclosure.

FIGS. 5A to 5D are diagrams illustrating the operations of the input circuits 40_1 to 40_4 in accordance with an embodiment of the present disclosure. Referring to FIG. 5A in conjunction with FIG. 4, the first stage of the input circuit 40_1 outputs the signal Sc, which has a logic low value '0', to the connection terminal Nc only when both the first clock signal CK90 and the second clock signal CK180 have a logic high value '1'. Otherwise, the first stage of the input circuit 40_1 outputs the signal Sc, which has a logic high value '1', to the connection terminal Nc. The second stage of the input circuit 40_1 outputs the first bit IN[0], which has a logic high value '1', to the sub-output terminal Nout only when both the signal Sc and the input indicating signal IIS[0] have logic low value '0'. Otherwise, the second stage of the input circuit 40_1 outputs the first bit IN[0], which has a logic low value '0', to the sub-output terminal Nout.

With such configurations, the signal Sc can be considered as a pulse signal. When the signal Sc has a logic low value '0', the signal Sc controls the first bit IN[0] has an inverse of the input indicating signal IIS[0], which provides a corresponding current to the output terminal OUT. The corresponding current and the equivalent impedance Zout combines and provides a corresponding voltage to the output terminal OUT.

Figure 5B:
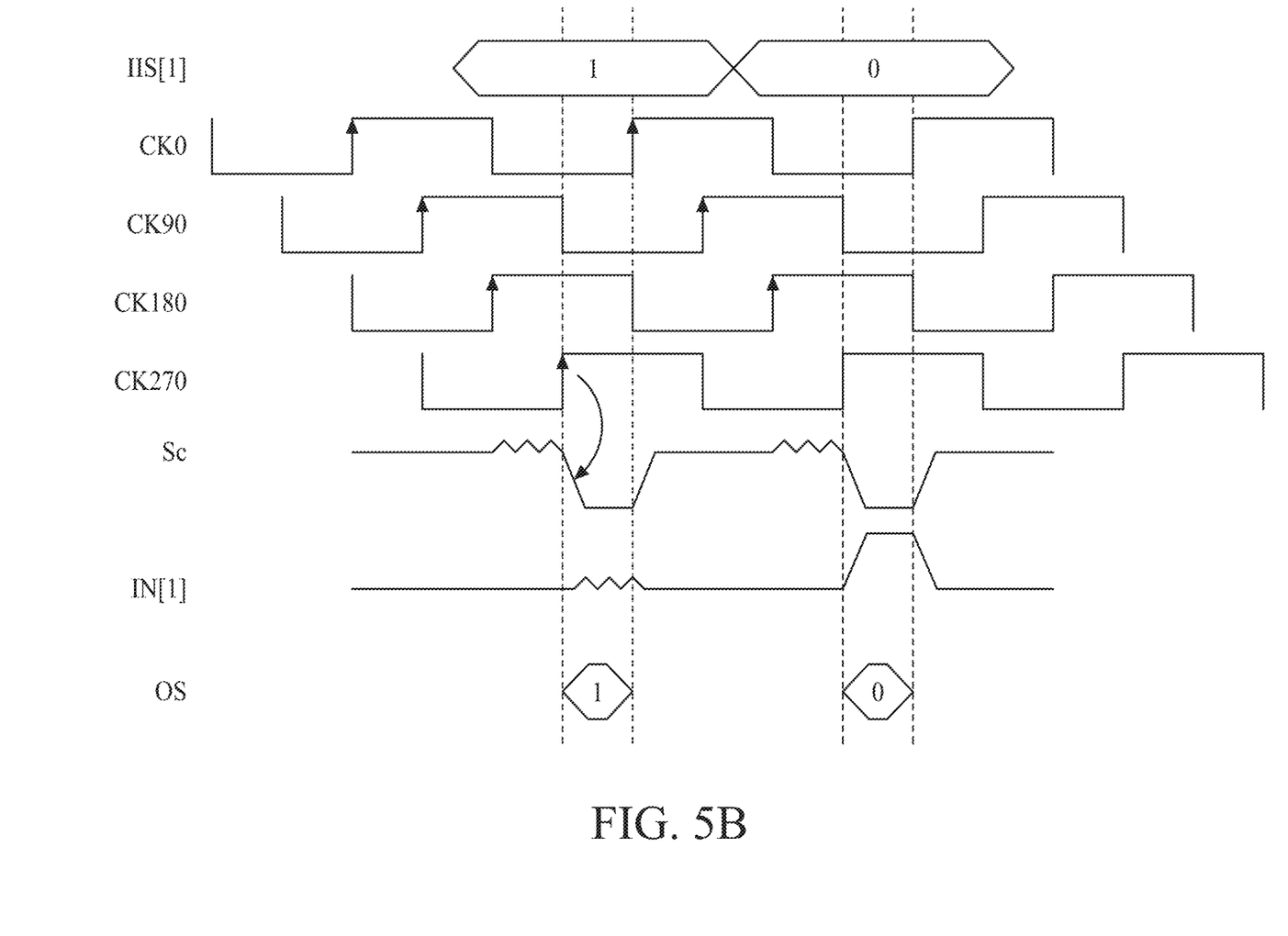

Referring to FIG. 5B in conjunction with FIG. 4, the first stage of the input circuit 40_2 outputs the signal Sc, which has a logic low value '0', to the connection terminal Nc only when both the second clock signal CK180 and the third clock signal CK270 have a logic high value '1'. Otherwise, the first stage of the input circuit 40_2 outputs the signal Sc, which has a logic high value '1', to the connection terminal Nc. The second stage of the input circuit 40_2 outputs the second bit IN[1], which has a logic high value '1', to the sub-output terminal Nout only when both the signal Sc and the input indicating signal IIS[1] have logic low value '0'. Otherwise, the second stage of the input circuit 40_2 outputs the second bit IN[1], which has a logic low value '0', to the sub-output terminal Nout.

As mentioned above, when the signal Sc has a logic low value '0', the signal Sc controls the second bit IN[1] has an inverse of the input indicating signal IIS[1], which provides a corresponding current to the output terminal OUT. The corresponding current and the equivalent impedance Zout combines and provides a corresponding voltage to the output terminal OUT.

Figure 5C:
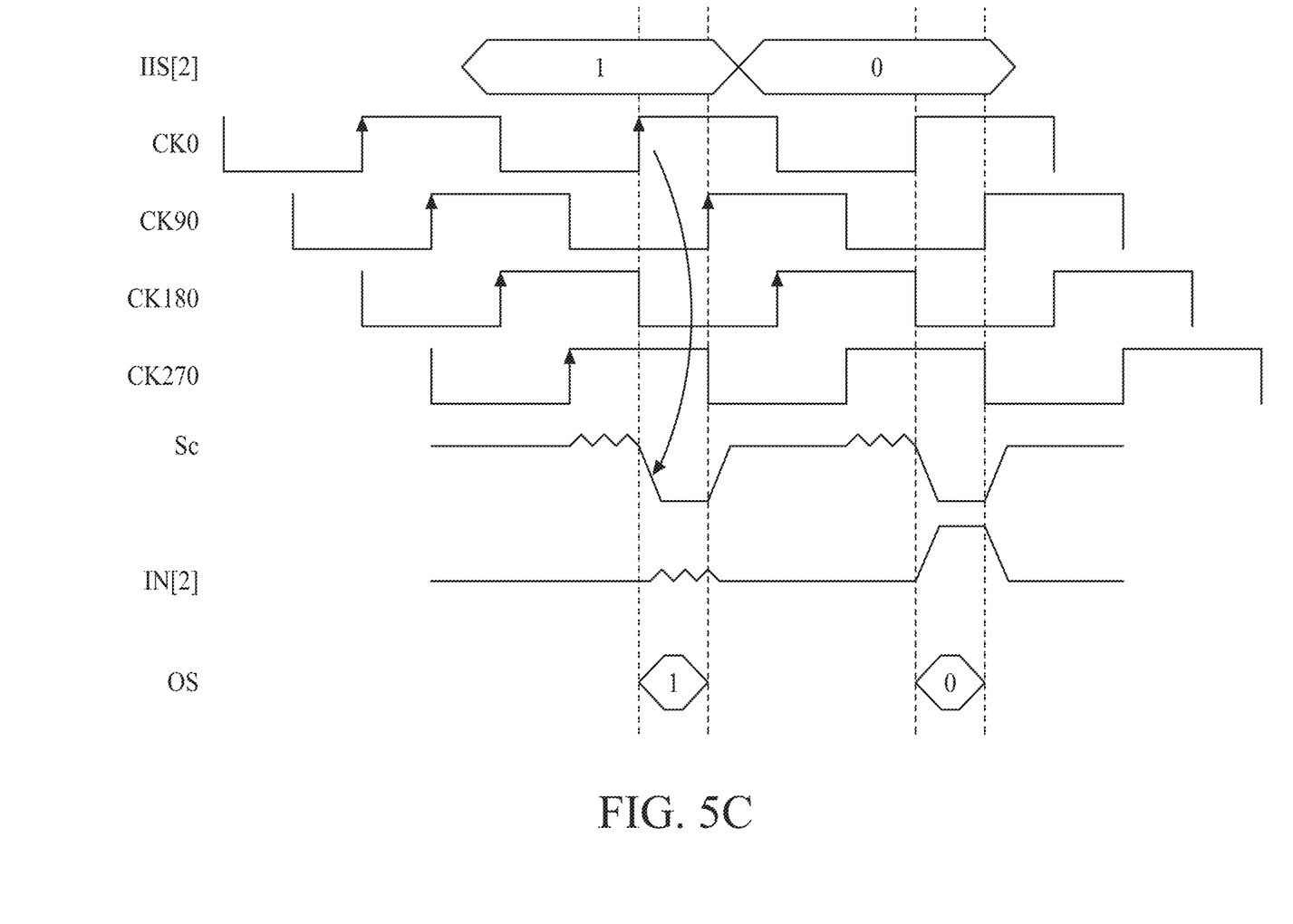

Referring to FIG. 5C in conjunction with FIG. 4, the first stage of the input circuit 40_3 outputs the signal Sc, which has a logic low value '0', to the connection terminal Nc only when both the third clock signal CK270 and the fourth clock signal CK0 have a logic high value '1'. Otherwise, the first stage of the input circuit 40_3 outputs the signal Sc, which has a logic high value '1', to the connection terminal Nc. The second stage of the input circuit 40_3 outputs the third bit IN[2], which has a logic high value '1', to the sub-output terminal Nout only when both the signal Sc and the input indicating signal IIS[2] have logic low value '0'. Otherwise, the second stage of the input circuit 40_3 outputs the third bit IN[2], which has a logic low value '0', to the sub-output terminal Nout.

As mentioned above, when the signal Sc has a logic low value '0', the signal Sc controls the third bit IN[2] has an inverse of the input indicating signal IIS[2], which provides a corresponding current to the output terminal OUT. The corresponding current and the equivalent impedance Zout combines and provides a corresponding voltage to the output terminal OUT.

Figure 5D:
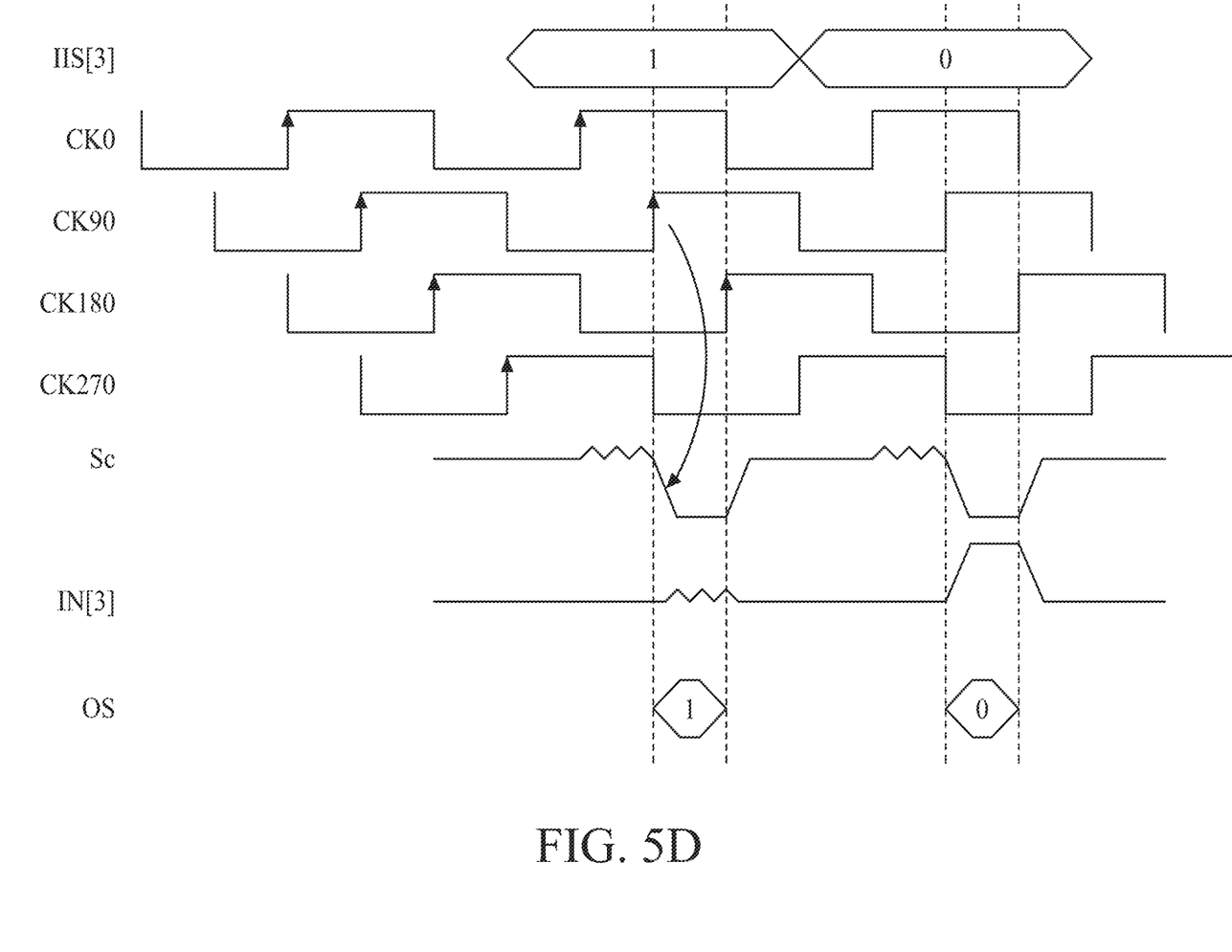

Referring to FIG. 5D in conjunction with FIG. 4, the first stage of the input circuit 40_4 outputs the signal Sc, which has a logic low value '0', to the connection terminal Nc only when both the fourth clock signal CK0 and the first clock signal CK90 have a logic high value '1'. Otherwise, the first stage of the input circuit 40_4 outputs the signal Sc, which has a logic high value '1', to the connection terminal Nc. The second stage of the input circuit 40_4 outputs the fourth bit IN[3], which has a logic high value '1', to the sub-output terminal Nout only when both the signal Sc and the input indicating signal IIS[3] have logic low value '0'. Otherwise, the second stage of the input circuit 40_4 outputs the fourth bit IN[3], which has a logic low value '0', to the sub-output terminal Nout.

As mentioned above, when the signal Sc has a logic low value '0', the signal Sc controls the fourth bit IN[3] has an inverse of the input indicating signal IIS[3], which provides a corresponding current to the output terminal OUT. The corresponding current and the equivalent impedance Zout combines and provides a corresponding voltage to the output terminal OUT.

Therefore, when the input circuits 40_1 to 40_4 finish the operations, the multiplexing circuit 1 outputs the serial output signal OS to the output terminal OUT.

Figure 6:
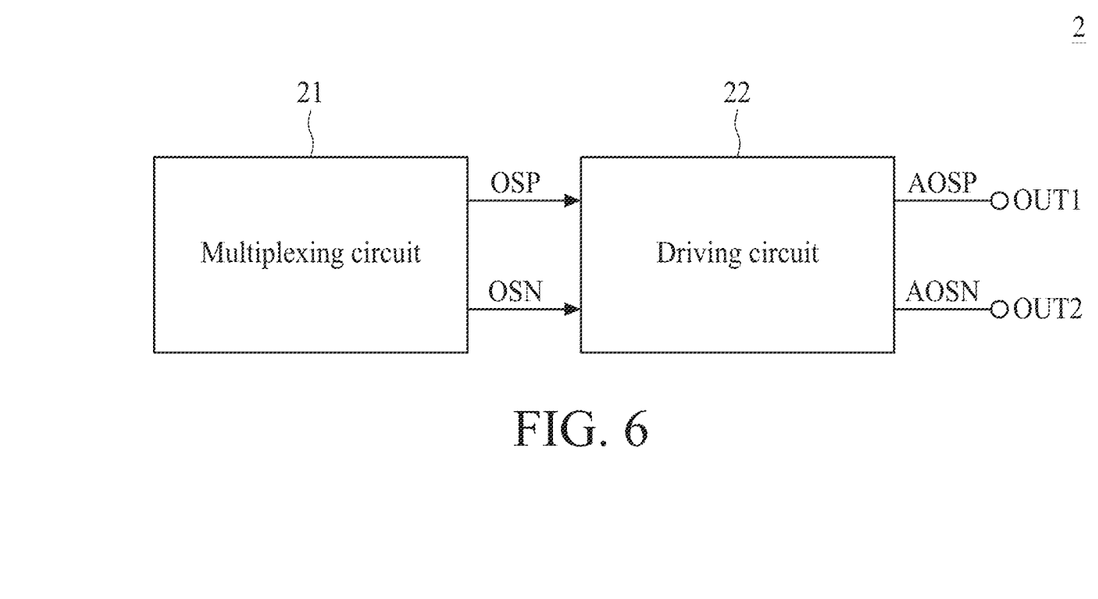
FIG. 6 is a diagram illustrating an output stage in accordance with an embodiment of the present disclosure.

FIG. 6 is a diagram illustrating an output stage 2 in accordance with an embodiment of the present disclosure. In some embodiments of the present disclosure, the output stage 2 includes a multiplexing circuit 21 and a driving circuit 22. In some embodiments of the present disclosure, the multiplexing circuit 21 includes two multiplexing circuits 1 shown in FIG. 3. In some embodiments of the present disclosure, the multiplexing circuit 21 outputs differential output signals OSP and OSN. In some embodiments of the present disclosure, the differential output signals OSP and OSN are generated in accordance with the operation described in the embodiment of FIGS. 5A to 5D. In the actual design, the distance between the multiplexing circuit 21 and the driving circuit 22 is not greater than 50 nm. With such configurations, the capacitance seen from the output terminal OUT of the multiplexing circuit 1 can be minimized.

In some embodiments of the present disclosure, the driving circuit 22 includes a low voltage current mode amplifier. In some embodiments of the present disclosure, the driving circuit 22 includes a differential input differential output amplifier. In some embodiments of the present disclosure, the driving circuit 22 receives the differential output signals OSP and OSN from the multiplexing circuit 21 as the differential input signals, and outputs differential output signals AOSP and AOSN to output terminals OUT1 and OUT2, respectively.

Figure 7:
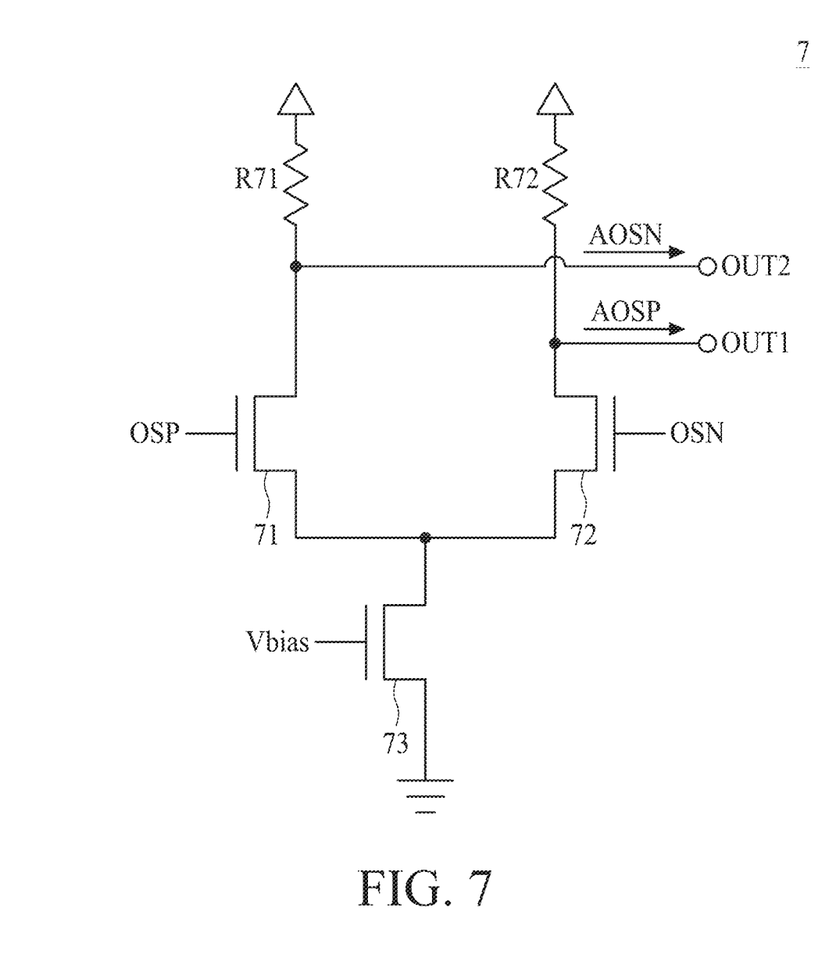
FIG. 7 is a diagram illustrating a driving circuit in accordance with an embodiment of the present disclosure.

FIG. 7 is a diagram illustrating a driving circuit 7 in accordance with an embodiment of the present disclosure. In some embodiments of the present disclosure, the driving circuit 7 is adapted to implement the driving circuit 22 shown in FIG. 6. In some embodiments of the present disclosure, the driving circuit 7 receives the differential output signals OSP and OSN and outputs the differential output signal AOSP and AOSN. In some embodiments of the present disclosure, the driving circuit 7 includes second type transistors 71, 72 and 73 and resistors R71 and R72.

In some embodiments of the present disclosure, the second type transistor 71 is implemented by a NMOS. In some embodiments of the present disclosure, a gate terminal of the second type transistor 71 is arranged to receive the output signal OSP. In some embodiments of the present disclosure, a drain terminal of the second type transistor 71 is coupled to one terminal of the resistor R71 and a source terminal of the second type transistor 71 is coupled to a drain terminal of the second type transistor 73.

In some embodiments of the present disclosure, the second type transistor 72 is implemented by a NMOS. In some embodiments of the present disclosure, a gate terminal of the second type transistor 72 is arranged to receive the output signal OSN. In some embodiments of the present disclosure, a drain terminal of the second type transistor 72 is coupled to one terminal of the resistor R72 and a source terminal of the second type transistor 72 is coupled to the drain terminal of the second type transistor 73.

In some embodiments of the present disclosure, the second type transistor 73 is implemented by a NMOS. In some embodiments of the present disclosure, a gate terminal of the second type transistor 73 is arranged to receive a bias voltage Vbias. In some embodiments of the present disclosure, a source terminal of the second type transistor 73 is coupled to the second reference voltage. For example, the second reference voltage is a ground voltage.

In some embodiments of the present disclosure, the resistor R71 is coupled between the first reference voltage and the drain terminal of the second type transistor 71. In some embodiments of the present disclosure, the resistor R72 is coupled between the first reference voltage and the drain terminal of the second type transistor 72. For example, the first reference voltage is a supply voltage arranged to provide a fixed voltage.

Those skilled in the art should understand that the second type transistors 71 and 72 constitute a differential input pair, and the second type transistor 73 is configured to be a current source arranged to provide a current through the second type transistor 73.

Figure 8:
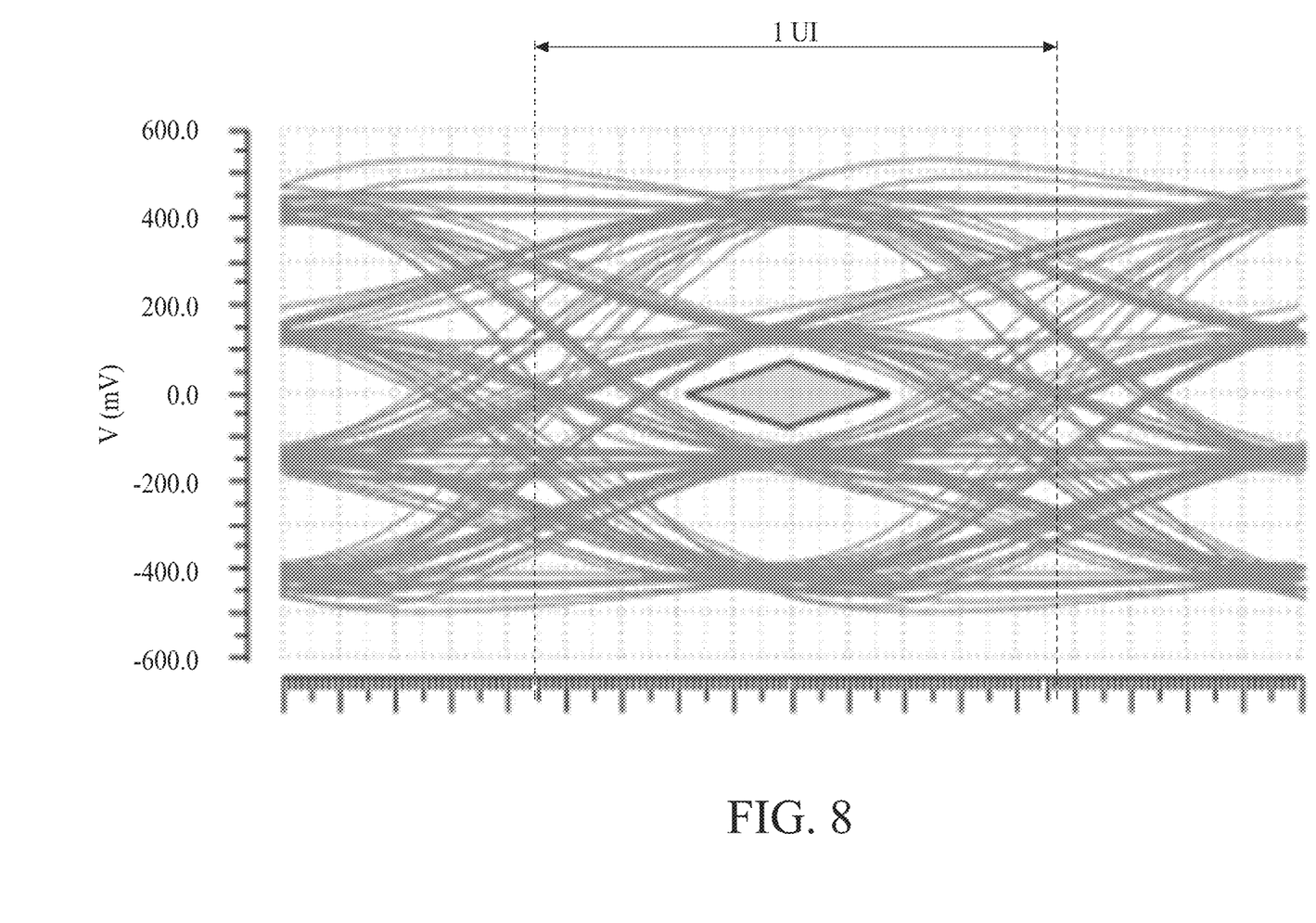
FIG. 8 is an eye diagram seen from output terminals of an output stage in accordance with an embodiment of the present disclosure.

FIG. 8 is an eye diagram seen from the output terminals OUT1 and OUT2 of the output stage 2 in accordance with an embodiment of the present disclosure. In some embodiments, by adopting the multiplexing circuit 1 proposed by the present disclosure, the eye window is about 0.52 unit interval (UI). In some embodiments, by adopting the multiplexing circuit 1 proposed by the present disclosure, the eye height is about 230 mV.

Figure 9:
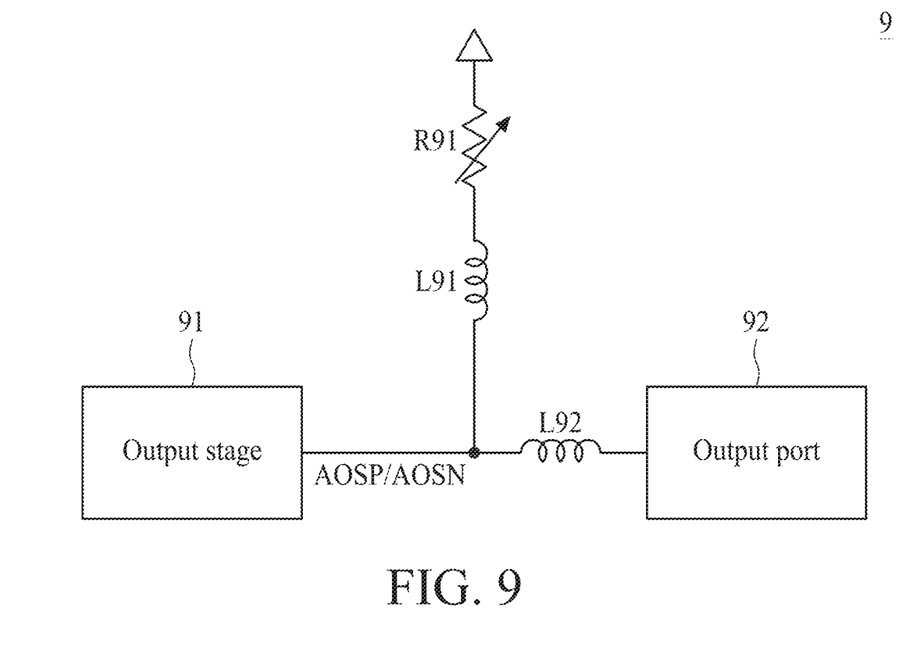
FIG. 9 is a diagram illustrating a semiconductor device in accordance with an embodiment of the present disclosure.

FIG. 9 is a diagram illustrating a semiconductor device 9 in accordance with an embodiment of the present disclosure. In some embodiments of the present disclosure, the semiconductor device 9 includes an output stage 91 and an output port 92. In some embodiments of the present disclosure, the output stage 91 is implemented by the output stage 7 shown in FIG. 7. In some embodiments of the present disclosure, the output port 92 is arranged to receive a transmission line for transmitting the output signals AOSP and AOPN from the output stage 91.

In some embodiments of the present disclosure, the semiconductor device 9 further includes inductors L91 and L92 and a resistor R91. In some embodiments of the present disclosure, one terminal of the inductor L91 is coupled to the output stage 91, and another terminal of the inductor L91 is coupled to one terminal of the resistor R91. In some embodiments of the present disclosure, one terminal of the inductor L92 is coupled to the output stage 91 and another terminal of the inductor L92 is coupled to the output port 92.

In some embodiments of the present disclosure, the resistor R91 is coupled between the first reference voltage and the inductor L91. In some embodiments of the present disclosure, the resistor R91 is arranged to match the impedance of the transmission line connected to the output port 92. In some embodiments of the present disclosure, the resistance of the resistor R91 is variable. In some embodiments of the present disclosure, the resistance of the resistor R91 is designed to be lower than 50 ohm.

Briefly summarized, the multiplexing circuit 1 proposed by the present disclosure adopts an impedance circuit 130, which is coupled between the gate terminal of the first type transistor 110 and the output terminal OUT. With the impedance circuit 130, the equivalent impedance seen from the output terminal OUT of the multiplexing circuit 1 has a peak in a high frequency band (e.g., from 10 GHz to 100 GHz) to achieve an effect of active peaking, which effectively minimizes gain difference between the low frequency gain and the high frequency gain, and reduce the ISI effect in further. Comparing to a passive peaking method, for example, using a passive inductor coupled to the output terminal OUT of the multiplexing circuit 1, the present disclosure facilitates the IC integration and consume the less area. Those skilled in the art should understand that a simple implementation can decrease the capacitance loading of metal routing and increase the frequency bandwidth.

According to an embodiment of the present disclosure, a multiplexing circuit is disclosed. The multiplexing circuit includes an output terminal, a first type transistor, a second type transistor and an impedance circuit. The first type transistor is coupled to the output terminal, wherein a gate terminal of the first type transistor is configured to receive a control signal and free from receiving a clock signal. The second type transistor is coupled to the output terminal, wherein a gate terminal of the second type transistor is configured to receive the clock signal, and the first type transistor is different from the second type transistor. The impedance circuit is arranged to provide an impedance between the gate terminal of the first type transistor and the output terminal, wherein the impedance circuit is free from connecting to the gate terminal of the second type transistor.

According to an embodiment of the present disclosure, an output stage of a semiconductor device is disclosed. The output stage is coupled to an output port of the semiconductor device for receiving a transmission line. The output stage includes a multiplexing circuit and a driving circuit. The multiplexing circuit includes an output terminal, a first type transistor, a second type transistor, an impedance circuit and an input circuit. The first type transistor is coupled to the output terminal. The second type transistor is coupled to the output terminal, wherein the first type transistor is different from the second type transistor. The impedance circuit is arranged to provide an impedance between a gate terminal of the first type transistor and the output terminal. The input circuit is arranged to receive a first clock signal and a second clock signal, and includes a sub-output terminal connected to a gate terminal of the second type transistor.

According to an embodiment of the present disclosure, a semiconductor device is disclosed. The semiconductor device includes an output stage and an output port. The output stage includes a multiplexing circuit and a driving circuit. The multiplexing circuit includes an output terminal, a first type transistor, a second type transistor, an impedance circuit and an input circuit. The first type transistor is coupled to the output terminal. The second type transistor is coupled to the output terminal, wherein the first type transistor is different from the second type transistor. The impedance circuit is arranged to provide an impedance between a gate terminal of the first type transistor and the output terminal. The input circuit is arranged to receive a first clock signal and a second clock signal, and includes a sub-output terminal connected to a gate terminal of the second type transistor. The driving circuit is coupled to the output terminal. The output port is coupled to the driving circuit and configured to receive a transmission line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multiplexing circuit, comprising:
an output terminal;
a first type transistor, coupled to the output terminal, wherein a gate terminal of the first type transistor is configured to receive a control signal and free from receiving a clock signal;
a second type transistor, coupled to the output terminal, wherein a gate terminal of the second type transistor is configured to receive the clock signal, and the first type transistor is different from the second type transistor; and
an impedance circuit arranged to provide an impedance between the gate terminal of the first type transistor and the output terminal, wherein the impedance circuit is free from connecting to the gate terminal of the second type transistor.

2. The multiplexing circuit of claim 1, wherein the impedance circuit includes a resistor, and a terminal of the resistor is connected to the gate terminal of the first type transistor while another terminal of the resistor is connected to the output terminal.

3. The multiplexing circuit of claim 1, wherein the multiplexing circuit is free from coupling a passive inductor to the output terminal of the multiplexing circuit.

4. The multiplexing circuit of claim 1, wherein the first type transistor is a P-type Metal Oxide Semiconductor (PMOS), a drain terminal of the PMOS is coupled to a first reference voltage, and a source terminal of the PMOS is coupled to the output terminal.

5. The multiplexing circuit of claim 1, wherein the second type transistor is an N-type Metal Oxide Semiconductor (NMOS), a drain terminal of the NMOS is coupled to the output terminal, and a source terminal of the NMOS is coupled to a second reference voltage.

6. An output stage of a semiconductor device, coupled to an output port of the semiconductor device for receiving a transmission line and comprising:
a multiplexing circuit, comprising:
an output terminal;
a first type transistor, coupled to the output terminal;
a second type transistor, coupled to the output terminal, wherein the first type transistor is different from the second type transistor; and
an impedance circuit, arranged to provide an impedance between a gate terminal of the first type transistor and the output terminal;
an input circuit arranged to receive a first clock signal and a second clock signal, including a sub-output terminal, and the sub-output terminal is connected to a gate terminal of the second type transistor; and
a driving circuit, coupled between the output terminal and the output port.

7. The output stage of claim 6, wherein the impedance circuit includes a resistor, and a terminal of the resistor is connected to the gate terminal of the first type transistor while another terminal of the resistor is connected to the output terminal.

8. The output stage of claim 6, wherein the multiplexing circuit is free from coupling a passive inductor to the output terminal.

9. The output stage of claim 6, wherein the first type transistor is a P-type Metal Oxide Semiconductor (PMOS), and the second type transistor is an N-type MOS (NMOS).

10. The output stage of claim 6, wherein a phase difference between the first clock signal and the second clock signal is 90 degrees.

11. The output stage of claim 6, wherein the input circuit comprises:
a first stage, including:
a first P-type Metal Oxide Semiconductor (PMOS), wherein a source terminal of the first PMOS is coupled to a first reference voltage, a drain terminal of the first PMOS is coupled to a connection terminal, and a gate terminal of the first PMOS is coupled to a first input terminal of the input circuit;
a first N type MOS (NMOS), wherein a drain terminal of the first NMOS is coupled to the connection terminal, a source terminal of the first NMOS is coupled to a second terminal, and a gate terminal of the first NMOS is coupled to a second input terminal of the input circuit; and
a second NMOS, wherein a drain terminal of the second NMOS is coupled to the second terminal, a source terminal of the second NMOS is coupled to a second reference voltage, and a gate terminal of the second NMOS is coupled to the first input terminal.

12. The output stage of claim 11, wherein the input circuit further comprises:
a second stage, including:
a second PMOS, wherein a source terminal of the second PMOS is coupled to the first reference voltage, a drain terminal of the second PMOS is coupled to a third terminal, and a gate terminal of the second PMOS is coupled to the connection terminal;
a third PMOS, wherein a source terminal of the third PMOS is coupled to the third terminal, a drain terminal of the third PMOS is coupled to a fourth terminal, and a gate terminal of the third PMOS is configured to receive an input indicating signal; and
a third NMOS, wherein a drain terminal of the third NMOS is coupled to the fourth terminal, a source terminal of the third NMOS is coupled to the second reference voltage, and a gate terminal of the third NMOS is coupled to the connection terminal;
wherein the fourth terminal is coupled to the sub-output terminal.

13. The output stage of claim 6, wherein the driving circuit comprises a differential input differential output amplifier.

14. The output stage of claim 13, wherein the driving circuit comprises a first N type Metal Oxide Semiconductor (NMOS), a second NMOS and a third NMOS, the first NMOS and the second NMOS constitute an input pair, and the third NMOS is arranged to be a current source connected between source terminals of the first NMOS and the second NMOS.

15. The output stage of claim 14, wherein the driving circuit comprises a first resistor and a second resistor, the first resistor is coupled between a first reference voltage and a drain terminal of the first NMOS, and the second resistor is coupled between the first reference voltage and a drain terminal of the second NMOS.

16. A semiconductor device, comprising:
an output stage, including:
a multiplexing circuit, including:
an output terminal;
a first type transistor, coupled to the output terminal;
a second type transistor, coupled to the output terminal, wherein the first type transistor is different from the second type transistor; and
an impedance circuit, arranged to provide an impedance between a gate terminal of the first type transistor and the output terminal;
an input circuit arranged to receive a first clock signal and a second clock signal, including a sub-output terminal, and the sub-output terminal is connected to a gate terminal of the second type transistor; and
a driving circuit, coupled to the output terminal; and
an output port, coupled to the driving circuit and configured to receive a transmission line.

17. The semiconductor device of claim 16, wherein the impedance circuit includes a resistor, and a terminal of the resistor is connected to the gate terminal of the first type transistor while another terminal of the resistor is connected to the output terminal.

18. The semiconductor device of claim 16, wherein the multiplexing circuit is free from coupling a passive inductor to the output terminal.

19. The semiconductor device of claim 16, wherein the first type transistor is a P-type Metal Oxide Semiconductor (PMOS), and the second type transistor is an N-type MOS (NMOS).

20. The semiconductor device of claim 16, wherein a phase difference between the first clock signal and the second clock signal is 90 degrees.

* * * * *